United States Patent [19]
Garay

[11] Patent Number: 5,115,375
[45] Date of Patent: May 19, 1992

[54] SNAP-IN RETAINER SLEEVE

[75] Inventor: Antonio A. Garay, Roselle, Ill.

[73] Assignee: Switchcraft Inc., Chicago, Ill.

[21] Appl. No.: 517,976

[22] Filed: Apr. 30, 1990

Related U.S. Application Data

[62] Division of Ser. No. 402,742, Sep. 5, 1989, abandoned.

[51] Int. Cl.[5] ............................................. H05K 7/02
[52] U.S. Cl. .................................... 361/400; 439/82
[58] Field of Search ............... 174/138 E, 138 G, 260, 174/261, 262, 265; 361/397, 400, 403, 404, 405, 413, 417, 418, 422, 427; 439/78, 79, 80, 81, 82, 84, 552, 554

[56] References Cited

U.S. PATENT DOCUMENTS

| | | | |
|---|---|---|---|
| 2,590,264 | 3/1952 | Meyers et al. | 24/295 |
| 2,623,086 | 12/1952 | Sampson | 24/453 X |
| 2,790,961 | 4/1957 | Camp | 439/554 |
| 2,972,727 | 2/1961 | Flanagan et al. | 439/82 |
| 3,504,328 | 3/1970 | Olsson | 439/82 |
| 3,654,583 | 4/1972 | Mancini | 439/82 |
| 3,681,744 | 8/1972 | Olsson | 439/82 |
| 4,205,889 | 6/1980 | Rieman | 439/82 |

FOREIGN PATENT DOCUMENTS

| | | | |
|---|---|---|---|
| 524892 | 5/1956 | Canada | 24/453 |
| 546146 | 6/1942 | United Kingdom | 24/295 |
| 635670 | 4/1950 | United Kingdom | 24/453 |
| 807726 | 1/1959 | United Kingdom | 24/295 |
| 855945 | 12/1960 | United Kingdom | 24/453 |

Primary Examiner—Leo P. Picard
Assistant Examiner—Donald A. Sparks
Attorney, Agent, or Firm—William R. Clark; Richard M. Sharkansky

[57] ABSTRACT

A retainer sleeve having a cylindrically curved wall of resilient material spaced radially from its longitudinal centerline for defining a tapered leading end portion, a midportion and an opposing trailing end portion of the sleeve. The defining wall has extended through its thickness a longitudinally coextensive first opening with an open end portion in the trailing end portion of the sleeve disposed in opposing relationship with a hinge portion of the wall. The hinge portion terminates in a closed end of a longitudinal second opening in the wall having an opposing open end portion disposed in diametric opposing relationship with an opposing open end portion of the first opening in the leading end portion of the sleeve. Thus, the first and second openings form therebetween first and second opposing flexible legs which have in the midportion of the sleeve respective proximal end portions. Extending radially outward from the proximal end portions of the legs are respective ramp-like tabs which have respective sloped surfaces directed toward the leading end portion of the sleeve and respective sheer end surfaces directed toward the trailing end portion of the sleeve. In the leading end portion of the sleeve, the flexible legs have respective cam-like distal end portions which curve radially outward of the sleeve respective distances greater than the extent of the respective ramp-like tabs.

1 Claim, 2 Drawing Sheets

SNAP-IN RETAINER SLEEVE

This application is a divisional of application Ser. No. 402,742 filed Sep. 5, 1989 now abandon.

BACKGROUND OF THE INVENTION

1. Field of the Invention

This invention relates generally to fastener devices and is concerned more particularly with a snap-in fastener device for securing an electrical device to a support panel.

2. Discussion of the Prior Art

An electrical device, such as an electrical connector, for example, generally is provided with a protective dielectric housing whereby the device may be mounted insulatingly on a support member. The housing, for example, may include a plurality of flanged portions through which extend respective mounting holes for receiving therein respective fastener devices. Thus, the electrical device may be mounted on a support panel, such as a printed circuit board, for example, by inserting respective screws through the mounting holes in the housing and aligned holes in the support panel. Threaded end portions of the screws protruding from the support panel may be engaged by respective nuts which then may be tightened sufficiently to secure the electrical device firmly to the support panel.

The described fastening operation, however, requires auxiliary tooling, such as a screwdriver or similar tool for engaging the screws and a socket wrench or similar tool for engaging the nuts in order to rotate one relative to the other. Also, this fastening operation consumes considerable time and labor which increases the cost of the assembly significantly. Furthermore, since the screws and nuts are separate components, one or the other may be misplaced thereby resulting in more time being lost in completing the fastening operation.

SUMMARY OF THE INVENTION

Accordingly, these and other disadvantages of the prior art are overcome by this invention providing a sanp-in retainer sleeve with resiliently operated latching means for readily securing the sleeve to a device and securing the device to a support member.

This retainer sleeve comprises an integral blank of resilient material formed into a cylindrical defining wall in radially spaced relationship with the longitudinal centerline of the sleeve. The defining wall has opposing longitudinal edges spaced apart to provide in the sleeve a co-extensive first longitudinal opening. One open end portion of the first longitudinal opening is disposed in a tapered leading end portion of the sleeve; and the other open end portion is disposed in an opposing trailing end portion of the sleeve. The trailing end portion has an outer surface disposed at a first radial distance from the longitudinal centerline of the sleeve and terminates in an outwardly extending flanged end of the sleeve.

Extending from the flanged end of the sleeve is a hinge portion of the defining wall which is disposed in opposing relationship with the adjacent end portion of the first longitudinal opening. The hinge portion terminates in an arcuate end of a second longitudinal opening which is disposed between opposing portions of the defining wall having protruding outwardly therefrom respective ramp-like tabs. The tabs have respective sloped surfaces directed toward the leading end of the sleeve and terminating in respective sheer end surfaces which are directed toward the flanged end of the sleeve. Each of the tabs extends outwardly of the sleeve to a second radial distance greater than said first radial distance to engage respective adjacent surface portions of a hole in a device wherein the tapered leading end portion is inserted. As a result, the defining wall of the sleeve moves circumferentially about the hinge portion of the wall to reduce the width of the first longitudinal opening thereby allowing the ramp-like tabs to pass through the hole. When the tabs clear the hole, the resiliency of the defining wall causes the tabs to spring into locking engagement with the far end surface of the hole and secure the sleeve to the device. Thus, the ramp-like tabs comprise a first resiliently operated latching means for securing the sleeve to a device.

The second longitudinal opening has adjacent its arcuate end a closed end portion which is disposed in diametrically opposed relationship with a laterally enlarged portion of the first longitudinal opening. An opposing open end portion of the second longitudinal opening extends to the leading end portion of the sleeve in opposing relationship with the adjacent open end portion of the first longitudinal opening. As a result, there is formed between the first and second longitudinal openings a pair of opposing legs which have respective distal end portions adjacent the leading end of the sleeve. The distal end portions of the legs flare outwardly to respective third radial distances greater than said second radial distances and converge toward one another to provide the leading end portion of the sleeve with a tapered configuration. Consequently, when the leading end portion of the sleeve is inserted into an aperture in a support panel, the legs flex inwardly toward one another from the arcuate end of the second longitudinal opening to the leading end of the sleeve. The resulting reduction in diametric size of the tapered end portion of the sleeve permits passage of the distal end portions of the legs through the aperture in the support panel. On the far side of the panel, the outwardly flared end portions of the legs spring outwardly to secure the sleeve and the device to the panel. Thus, the flexible legs constitute a second resiliently operated latching means for securing the sleeve and the device to a support member.

BRIEF DESCRIPTION OF THE DRAWINGS

For a better understanding of this invention, reference is made in the following detailed description to the accompanying drawings wherein.

DESCRIPTION OF THE PREFERRED EMBODIMENT

Figure 1:
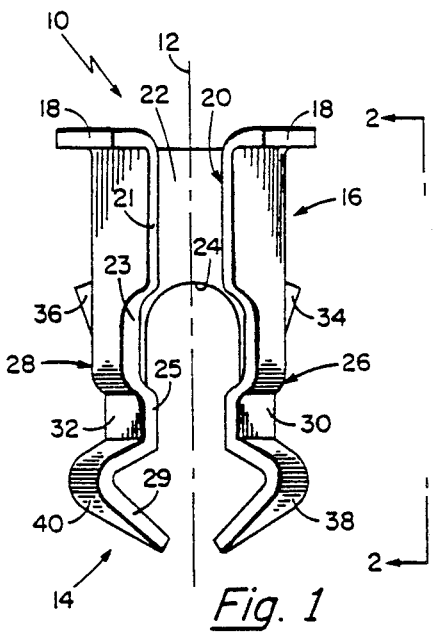
FIG. 1 is an enlarged elevational view of a retainer sleeve embodying the invention.
Figure 2:
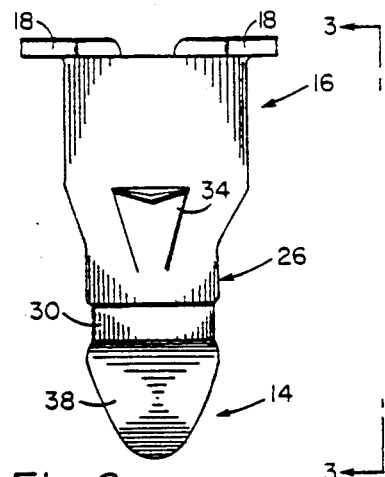
FIG. 2 is a side view taken along line 2—2 shown in FIG. 1 and looking in the direction of the arrows.

Referring to the drawings wherein like characters of reference designate like parts, there is shown in FIGS. 1-4 an integral retainer sleeve 10 having a cylindrical defining wall spaced radially from a longitudinal centerline 12 of the sleeve. Sleeve 10 is made of resilient material, such as tempered brass alloy sheet stock having a thickness of about ten thousandths of an inch, for example. The sleeve 10 is provided with a tapered leading end portion 14 and an opposing trailing end portion 16 which has an outer surface disposed at a first radial distance from the longitudinal centerline 12. Trailing end portion 16 terminates in an outwardly extending flanged end of sleeve 10 comprising a plurality of angularly spaced, flange portions 18 which extend integrally in an orthogonal direction from the trailing end portion 16 of sleeve 10.

The defining wall of sleeve 10 has opposing longitudinal edges which are normally spaced apart to provide the sleeve with a co-extensive first longitudinal opening 20. Opening 20 has, in the trailing end portion 16 of sleeve 10, an open end portion 21 provided with a predetermined first width when the sleeve is in a relaxed state. Extending from the flanged end of sleeve 10 in opposing relationship with the end portion 21 of opening 20 is a hinge portion 22 of sleeve 10 which terminates in an arcuate end of a second longitudinal opening 24. The second longitudinal opening 24 has adjacent its arcuate end a closed end portion which is disposed in diametrically opposed relationship with a laterally enlarged midportion 23 of the first opening 20. The enlarged midportion 23 of first opening 20 is provided with a second width which is greater than said predetermined first width. When the sleeve 10 is in a relaxed state, the width of enlarged midportion 23 is similar to the width of the closed end portion of second opening 24.

Disposed between the enlarged midportion 23 of first opening 20 and the closed end portion of second opening 24 are proximal end portions of respective flexible legs 26 and 28 which pivot about the arcuate end of second opening 24. The proximal end portions of flexible legs 26 and 28 terminate in respective belt-like transitional portions 30 and 32 which may have respective inwardly drawn, outer surfaces. Consequently, the outer surfaces of transitional portions 30 and 32 may be disposed at respective radial distances less than said first radial distance of the outer surface of trailing end portion 16 from the longitudinal centerline 12. Protruding integrally outward from the proximal end portions of flexible legs 26 and 28 are respective opposing ramp-like tabs 34 and 36 which extend to respective second radial distances greater than said first radial distance. Each of the tabs 30 and 32 has a sloped surface directed toward the tapered leading end portion 14 of sleeve 10 and terminating in an abruptly angulated or sheer end surface which is directed toward the trailing end portion 16 of sleeve 10. The sheer end surfaces of ramp-like tabs 30 and 32 are disposed adjacent the arcuate end of second opening 24 and are spaced a predetermined longitudinal first distance from the flanged end of sleeve 10.

The respective transitional portions 30 and 32 of flexible legs 26 and 28 are spaced apart circumferentially by interposed portions 25 and 27 of longitudinal openings 20 and 24, respectively. Portions 25 and 27 have respective widths which normally are similar to one another and to the width of the end portion 21 of opening 20 when the sleeve 10 is in a relaxed state. Communicating with the respective portions 25 and 27 of openings 20 and 24 are respective open end portions 29 and 31 thereof which extend in opposing relationship with one another to the leading end of sleeve 10. The respective end portions 29 and 31 of openings 20 and 24 may be provided with respective similar configurations, such as pear-shaped with the respective small diameter end portions thereof adjacent the leading end of sleeve 10, for example. Disposed circumferentially between the respective end portions 29 and 31 of openings 20 and 24 are outwardly curved, distal end portions, 38 and 40, respectively, of the flexible legs 26 and 28. The distal end portions 38 and 40 may be provided with respective scallop configurations and flare outwardly from the belt-like transitional portions 30 and 32, respectively, of the flexible legs 26 and 28. As a result, the distal end portions 38 and 40 have respective outer surface portions disposed at respective third radial distances which are greater than said second radial distances of said respective ramp-like tabs 34 and 36 from the longitudinal centerline 12 of sleeve 10. From these third radial distances, the respective distal end portions 38 and 40 extend convergently toward one another and terminate in spaced relationship to form the tapered leading end portion 14 of sleeve 10.

Figure 3:
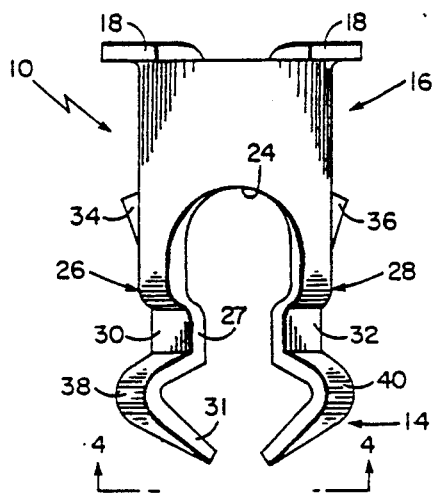
FIG. 3 is a rear elevational view taken along line 3—3 shown in FIG. 2 and looking in the direction of the arrow.
Figure 5:
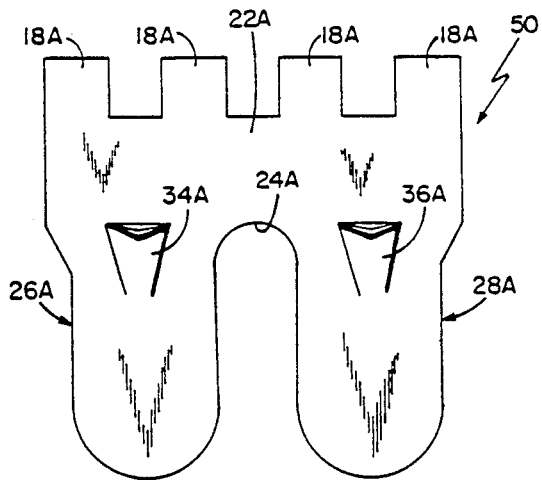
FIG. 5 is an elevational schematic view of a stamped blank from which the retainer sleeve shown in FIGS. 1–4 may be fabricated.
Figure 4:
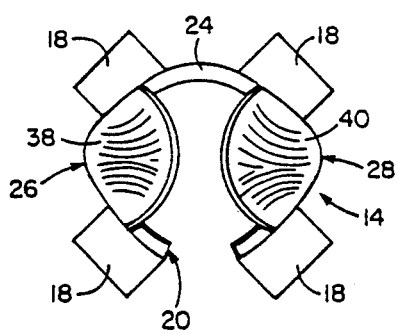
FIG. 4 is a bottom view sleeve taken along line 4—4 shown in FIG. 3 and looking in the direction of the arrows.

As illustrated in FIG. 5, a blank 50 may be stamped from a band (not shown) of resilient material having a suitable thickness for forming the defining wall of retainer sleeve 10. The blank 50 is provided with a longitudinal opening 24A which is disposed between two flexible legs 26A and 28A, respectively, and which has an arcuate end terminating a hinge portion 22A of the blank. During the stamping operation, the blank 50 may be provided with a coplanar plurality of flange portions 18A and with a-shallow pair of protruding tabs 34A and 36A. In a subsequent die operation (not shown), the flange portions 18A may be bent orthogonally to the plane of blank 50; and the tabs 34A and 36A may be extended fully from the plane of blank 50. Next, the distal end portions of flexible legs 26A and 28A may be provided with respective scallop configurations thereby producing the adjacent transitional portions 30 and 32, respectively, shown in FIG. 1. Finally, with the hinge portion 22A serving as a fulcrum, adjacent portions of the blank 50 on either side of the hinge portion 22A and the opening 24A are curved cylindrically to have their respective concave inner surfaces facing one another. As a result, the longitudinal openings 20 and 24 shown in FIGS. 1 and 3 are provided with the described contours. Thus, the retainer sleeve 10 may be mass produced in an inexpensive and efficient manner.

Figure 6A:
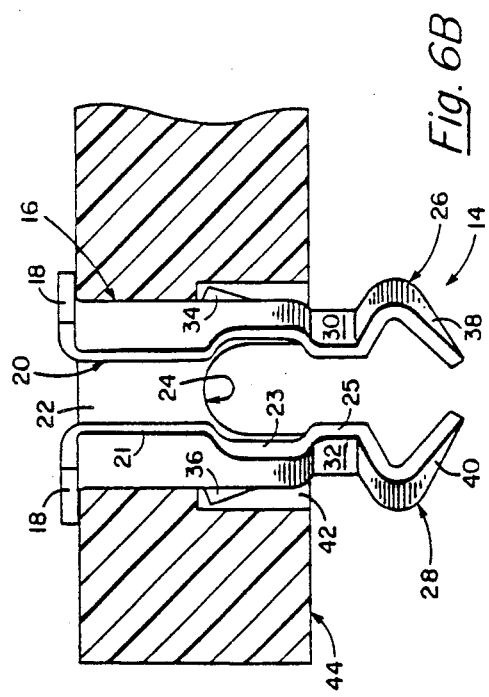
FIGS. 6A and 6B are fragmentary views, partly in section, of the retainer sleeve shown in FIGS. 1–4 being installed and fully installed, respectively, in a hole in a device.
Figure 6B:
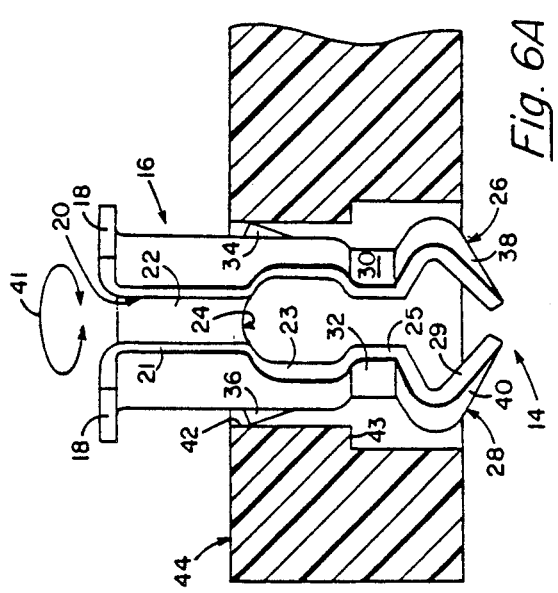

In practice, as shown in FIGS. 6A and 6B, the retainer sleeve 10 has its tapered leading end portion 14 inserted into a hole 42 in an electrical device 44, such as an electrical connector, for example. Hole 42 has an entrace end portion and a larger diameter exit end portion meeting at a junction where a resulting annular shoulder 43 is formed within hole 42. When the tapered leading end portion 14 of sleeve 10 is pressed axially through the hole 42, the respective sloped surfaces of ramp-like tabs 34 and 36 are brought into rubbing engagement with the entrance rim of hole 42. As a result, the tabs 34 and 36 function as respective cams and force the cylindrical half portions of sleeve 10 to pivot about the hinge portion 22, as indicated by the circular double-ended arrow 41. This circumferential movement of the defining wall of sleeve 10 causes a reduction in width of the longitudinal opening 20 and a corresponding reduction in diametric size of the sleeve 10 thereby enabling the ramp-like tabs 34 and 36 to pass through the entrance end portion of hole 42.

When the ramp like tabs 34 and 36 clear the annular shoulder 43, the resiliency of the sleeve 10 causes a reversal in the circumferential movement of its defining wall whereby the sleeve 10 returns to a relaxed state. Consequently, the opening 20 increases to its initial width and the sleeve 10 enlarges to its initial diametric size so that the respective sheer end surfaces of the ramp-like tabs 34 and 36 snap into latching engagement with the annular shoulder 43. As a result, the flange portions 18 seat on the surface of device 44 adjacent the entrance end of hole 42; and the tapered leading end portion 14 of sleeve 10 protrudes from the opposing surface of device 44. Accordingly, the ramp-like tabs 34 and 36 extending radially from the resilient defining wall of sleeve 10 provided with the coextensive longitudinal opening 20 comprises a first latching means for securing the retainer sleeve 10 to the device 44.

Figure 7A:
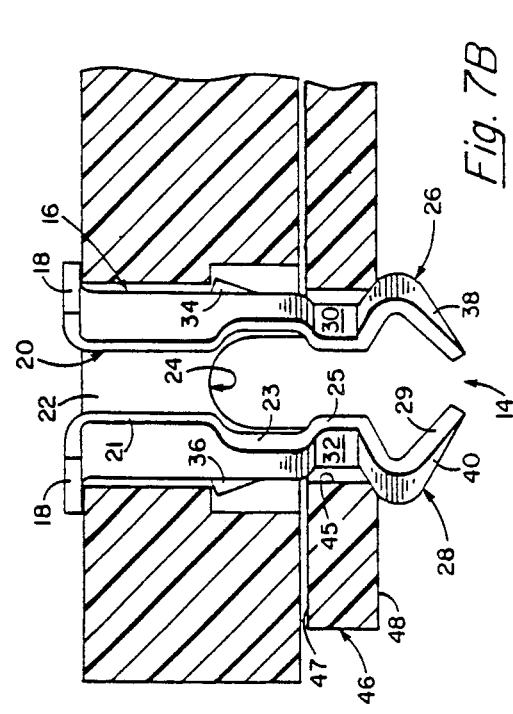
FIGS. 7A and 7B are fragmentary views, partly in section, of the assembly shown in FIG. 6B being installed and fully installed, respectively, within an aperture in a support panel.
Figure 7B:
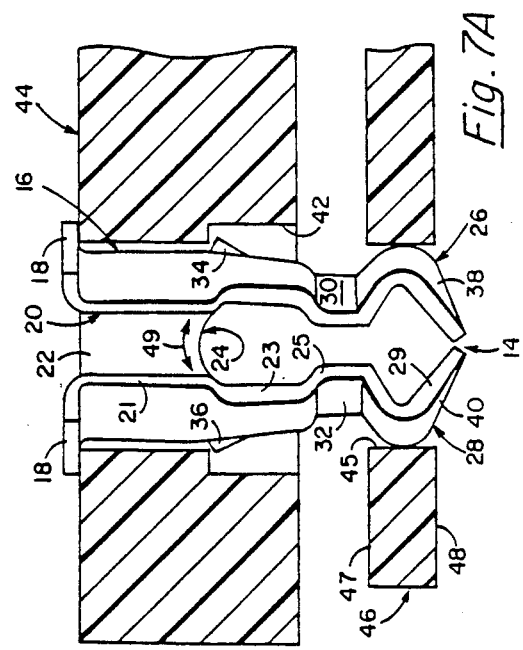

As shown in FIGS. 7A and 7B, the tapered leading end portion 14 protruding from the device 44 is inserted into an aperture 45 in a support panel 46, such as a printed circuit board, for example. Aperture 45 has an entrance rim in a surface 47 of panel 46 adjacent the device 44, and has an exit rim in an opposing surface 48 of panel 46. Therefore, in the inserted leading end portion 14 of sleeve 10, the distal end portions 38 and 40 of flexible legs 26 and 28, respectively, have their convergently extended portions brought into rubbing engagement with the entrance rim of aperture 45 in surface 47 of panel 46. Consequently, the distal end portions 38 and 40 function as respective cams and force the spaced terminal ends of the distal end portions 38 and 40 to move laterally toward one another. Also, the flexible legs 26 and 28 pivot arcuately about the closed end of longitudinal opening 24, as indicated by the arcuate, double-ended arrow 49 shown in FIG. 7A.

The resulting decrease in diametric size of the leading end portion 14 of sleeve 10 allows the scallop-shaped, distal end portions 38 and 40 of flexible legs 26 and 28, respectively, to pass through the aperture 45. When the extreme radial curvatures of the distal end portions 38 and 40, respectively, clear the surface 48 of panel 46, the resiliency of flexible legs 26 and 28 causes the respective distal end portions 38 and 40 thereof to spring apart. As a result, the respective portions of the distal end portions 38 and 40 flaring outwardly from the transitional portions 30 and 32, respectively, snap into latching engagement with the surface 47 of panel 46 adjacent the exit rim of aperture 45. Accordingly, the flexible legs 26 and 28 having the outwardly curved, distal end portions 38 and 40, respectively, constitute a second resiliently operated latching means for securing the retainer sleeve 10 and the device 44 to the support panel 46.

Figure 8:
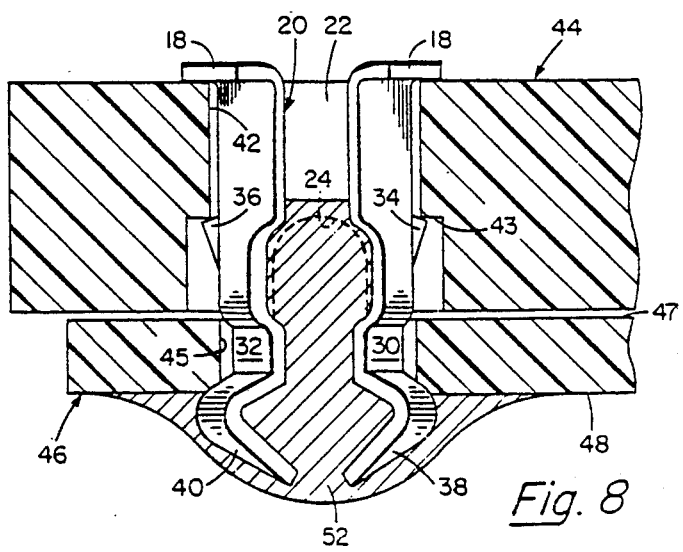
FIG. 8 is a fragmentary view, partly in section, of the assembly shown in FIG. 7B after a solder operation.

As shown in FIG. 8, the resulting assembly may undergo a wave soldering operation (not shown), particularly when the support panel 46 constitutes a printed circuit board. Due to a capillary action enhanced by the cylindrical defining wall of retainer sleeve 10, a column of solder 52 rises in the sleeve 10 and adheres to the inner surface thereof. When cooled, the solidified column of solder 52 forms a rigid inner core which converts the retainer sleeve 10 into a solid fastener device which does not require auxiliary tools for its installation in the device 44 or the support panel 46. Furthermore, if a plurality of the retainer sleeves 10 are installed, as described, in respective holes 42 in the device 44 and aligned apertures 45 in the support panel 46 and provided with respective cores of solder 52, the device 44 would be retained securely in place on the support panel 46.

From the foregoing, it will be apparent that all of the objectives have been achieved by the structures and methods described herein. It also will be apparent, however, that various changes may be made by those skilled in the art without departing from the spirit of the invention, as expressed in the appended claims. It is to be understood, therefore, that all matter shown and described is to be interpreted as illustrative and not in a limiting sense.

What is claimed is:

1. Apparatus comprising:
    an electrical device having a hole with a first portion having a first diameter and a second portion having a second diameter larger than the first diameter providing a shoulder between the first and second portions;
    a printed circuit board having an aperture with a third diameter;
    a fastener inserted through the hole in the electrical device and the aperture in the printed circuit board for holding the electrical device to the printed circuit board, the fastener comprising a sleeve having a flange at one end engaging a surface of the electrical device adjacent the first portion of the hole, the sleeve having at least one sidewardly extended tab positioned within the second portion of the hole and engaging the shoulder to secure the fastener to the electrical device, the tab plus the sleeve having a dimension greater than the first diameter and the tab being inwardly flexible wherein the fastener is adapted for insertion legs-first into the first portion of the hole with the tab flexed inwardly until passing into the second portion wherein the tab flexes outwardly and engages the shoulder;
    the fastener further comprising a pair of outwardly bowed legs inserted through the aperture in the printed circuit board to secure the electrical device flushly against the printed circuit board, the outwardly bowed legs having a diameter larger than the third diameter and the legs being inwardly flexible wherein the fastener is adapted for inserting the legs through the aperture of the printed circuit board with the legs flexed inwardly until passing through the aperture wherein the legs flex outwardly to engage the printed circuit board to the electrical device; and
    solder positioned between the legs and forming a rigid inner core for preventing the legs from flexing inwardly to remove said electrical device from said printed circuit board.

* * * * *